United States Patent [19]
Troy

[11] Patent Number: 5,831,435
[45] Date of Patent: Nov. 3, 1998

[54] BATTERY TESTER FOR JIS STANDARD

[75] Inventor: Michael E. Troy, Lockport, Ill.

[73] Assignee: Midtronics, Inc., Burr Ridge, Ill.

[21] Appl. No.: 834,355

[22] Filed: Apr. 16, 1997

[51] Int. Cl.$^6$ .......................... G01N 27/416; G01R 31/36
[52] U.S. Cl. .......................... 324/426; 324/427; 702/63; 702/81
[58] Field of Search .................................. 324/426, 427, 324/430; 702/63, 81

[56] References Cited

U.S. PATENT DOCUMENTS

| | | | |
|---|---|---|---|
| 3,676,770 | 7/1972 | Sharaf et al. | 324/430 |
| 3,873,911 | 3/1975 | Champlin | 324/430 |
| 3,909,708 | 9/1975 | Champlin | 324/431 |
| 3,946,299 | 3/1976 | Christianson et al. | 320/43 |
| 4,193,025 | 3/1980 | Frailing et al. | 324/427 |
| 4,322,685 | 3/1982 | Frailing et al. | 324/429 |
| 4,423,378 | 12/1983 | Marino et al. | 324/427 |
| 4,697,134 | 9/1987 | Burkum et al. | 320/48 |
| 4,719,428 | 1/1988 | Liebermann | 324/436 |
| 4,816,768 | 3/1989 | Champlin | 324/428 |
| 4,825,170 | 4/1989 | Champlin | 324/436 |
| 4,881,038 | 11/1989 | Champlin | 324/426 |
| 4,912,416 | 3/1990 | Champlin | 324/430 |
| 4,929,931 | 5/1990 | McCuen | 340/636 |
| 4,968,941 | 11/1990 | Rogers | 324/428 |
| 5,140,269 | 8/1992 | Champlin | 324/433 |
| 5,343,380 | 8/1994 | Champlin | 363/46 |
| 5,572,136 | 11/1996 | Champlin | 324/426 |
| 5,574,355 | 11/1996 | McShane et al. | 320/39 |
| 5,585,728 | 12/1996 | Champlin | 324/427 |
| 5,598,098 | 1/1997 | Champlin | 324/430 |

FOREIGN PATENT DOCUMENTS

WO 93/22666  11/1993  WIPO.

OTHER PUBLICATIONS

E. Willihnganz and Peter Rohner, "Battery Impedance, Farads, Milliohms, Microhenries", *Electrical Engineering*, Sep. 1959.

Power Generation Committee of the IEEE Power Engineering Society, "IEEE Recommended Practice for Maintenance, Testing and Replacement of Large Lead Storage Batteries for Generating Stations and Substations", *ANSI/IEEE Std 450–1980*, Mar. 9, 1987.

F.J. Vaccaro and P. Casson, "Internal Resistance, Harbinger of Capacity loss in Starved Electrolyte Sealed Lead Acid Batteries", *IEEE CH247708/87/000–0128*, 1987. (month unavailable).

Sheldon DeBardelaben–New York Telephone Company, "Determining the End of Battery Life", *Ch2328–3/86/0000–0365 1986 IEEE*. (month unavailable).

Japanese Standards Association, "JIS Japanese Industrial Standard–Lead Acid batteries for automobiles," *UDC 621.355.2:629.113.066*, Nov. 1995.

*Primary Examiner*—Glenn W. Brown
*Attorney, Agent, or Firm*—Westman, Champlin & Kelly, P.A.

[57] ABSTRACT

A method and apparatus for testing JIS rated batteries is disclosed. A JIS battery type reference number is provided to a battery tester. Battery test information for the JIS rated battery is determined as a function of the JIS battery type reference number. The battery tester provides a battery test on the JIS rated battery using the determined battery test information. A battery tester output indicative of a condition of the JIS rated battery is provided based upon the test result.

6 Claims, 3 Drawing Sheets

BATTERY TESTER FOR JIS STANDARD

BACKGROUND OF THE INVENTION

The present invention relates to testing storage batteries. More specifically, the present invention relates to testing batteries rated under the Japanese Industrial Standard (JIS).

Storage batteries, such as lead acid storage batteries of the type used in the automotive industry, have existed for many years. However, understanding the nature of such storage batteries, how such storage batteries operate and how to accurately test such batteries has been an ongoing endeavor and has proved quite difficult. Storage batteries consist of a plurality of individual storage cells electrically connected in series. Typically each cell has a voltage potential of about 2.1 volts. By connecting the cells in series, the voltages of the individual cells are added in a cumulative manner. For example, in a typical automotive storage battery, six storage cells are used to provide a total voltage when the battery is fully charged of 12.6 volts.

There has been a long history of attempts to accurately test the condition of storage batteries. A simple test is to measure the voltage of the battery. If the voltage is below a certain threshold, the battery is determined to be bad. However, this test is inconvenient because it requires the battery to be charged prior to performing the test. If the battery is discharged, the voltage will be low and a good battery may be incorrectly tested as bad. Furthermore, such a test does not give any indication of how much energy is stored in the battery. Another technique for testing a battery is referred as a load test. In a load test, the battery is discharged using a known load. As the battery is discharged, the voltage across the battery is monitored and used to determine the condition of the battery. This technique requires that the battery be sufficiently charged in order that it can supply current to the load.

More recently a technique has been pioneered by Dr. Keith S. Champlin for testing storage batteries by measuring the conductance of the batteries. This technique is described in a number of United States patents obtained by Dr. Champlin, for example, U.S. Pat. No. 3,873,911, issued Mar. 25, 1975, to Champlin, entitled ELECTRONIC BATTERY TESTING DEVICE; U.S. Pat. No. 3,909,708, issued Sep. 30, 1975, to Champlin, entitled ELECTRONIC BATTERY TESTING DEVICE; U.S. Pat. No. 4,816,768, issued Mar. 28, 1989, to Champlin, entitled ELECTRONIC BATTERY TESTING DEVICE; U.S. Pat. No. 4,825,170, issued Apr. 25, 1989, to Champlin, entitled ELECTRONIC BATTERY TESTING DEVICE WITH AUTOMATIC VOLTAGE SCALING; U.S. Pat. No. 4,881,038, issued Nov. 14, 1989, to Champlin, entitled ELECTRONIC BATTERY TESTING DEVICE WITH AUTOMATIC VOLTAGE SCALING TO DETERMINE DYNAMIC CONDUCTANCE; U.S. Pat. No. 4,912,416, issued Mar. 27, 1990, to Champlin, entitled ELECTRONIC BATTERY TESTING DEVICE WITH STATE-OF-CHARGE COMPENSATION; and U.S. Pat. No. 5,140,269, issued Aug. 18, 1992, to Champlin, entitled ELECTRONIC TESTER FOR ASSESSING BATTERY/CELL CAPACITY.

Most battery testing technologies in use today require the battery rating (i.e. Cold Cranking Amps or CCA) for reference in making battery state of health decisions. This is true of both conductance and load test methodologies. For SAE rated batteries, this information is usually found directly on the battery label as a numeric CA or CCA rating. The battery manufacturer in accordance with Battery Council International (BCI) standards establishes this numeric reference rating. These standards ensure consistency in battery performance rating from one manufacturer to another. Therefore, the battery CA or CCA rating can be used for test purposes on all batteries conforming to BCI standards.

Several battery rating standards exist in the world today. These standards include: DIN, IEC, and the new European standard EN. For each of these standards, the specific battery rating is represented by a numeric value (cranking power) which can be directly converted to an SAE CA or CCA number by a simple multiplication factor. Therefore, battery testing utilizing a numeric rating can be easily accomplished.

In Japan, batteries are not rated by their numeric battery cranking power. Japanese battery manufacturers design and manufacture batteries according to Japanese Industrial Standaids (JIS). Lead-acid storage batteries used for purposes such as starting, lighting and ignition of automobiles is defined by standard JIS D 5301. This standard defines performance, testing, construction, and labeling criteria for JIS rated batteries. Unlike SAE rated batteries, JIS rated batteries are not labeled with their CA or CCA battery performance rating. JIS rated batteries are labeled only with a type designator of the format: 34B19R. The first numbers in the battery designator present the performance rating of the battery. This performance rating number is very different from the SAE performance rating CA or CCA number. Therefore, testing JIS batteries by their CA or CCA performance numbers is very difficult due to the unavailability of the CA or CCA rating on the JIS battery label. While battery testers which can convert from one cranking power standard to another (e.g., from SAE to IEC) are known, existing battery testers cannot convert the battery test applied from one standard to the next as a function of the type of battery. Further, existing battery testers are not suited for applying tests correlated for cranking amp ratings to JIS rated batteries.

SUMMARY OF THE INVENTION

The present invention offers solutions to problems associated with the aforementioned problems. The present invention provides a method and apparatus for testing JIS rated batteries. In the method, a JIS battery type reference number is input into a battery tester. Battery test information is determined for the battery as a function of the JIS battery type reference number. A battery test is performed on the JIS rated battery using the battery tester and the determined battery test information and a test result is obtained. A battery tester output is provided which is indicative of the condition of the battery based upon the test results.

Similarly, the apparatus includes input circuitry receiving JIS battery type information. Battery test circuitry coupleable to the battery performs a battery test on the battery and provides a battery test result. The battery test circuitry determines battery test information for the battery as a function of the received JIS battery type information. The battery test circuitry performs the battery test using the determined battery test information. Output circuitry provides an output indicative of a condition of the JIS rated battery based upon the battery test results.

DETAILED DESCRIPTION OF THE PREFERRED EMBODIMENTS

The present invention provides a new and useful technique for monitoring batteries rated under the Japanese Industrial Standard (JIS) for Lead-Acid batteries for automobiles, JIS D 5301 (1991, last revised in 1995). The JIS for Lead-Acid batteries for automobiles is herein incorporated by reference. The present invention is for use with any battery tester or testing technique and those discussed herein are strictly as examples. The present invention provides a method and apparatus for applying battery tests, designed for use with batteries rated using standards (e.g., SAE, BIN, IEC, and EN) which are directly indicative of the battery's cranking power, to batteries rated under the Japanese Industrial Standards (JIS) for which the cranking power is not readily apparent.

Figure 1:
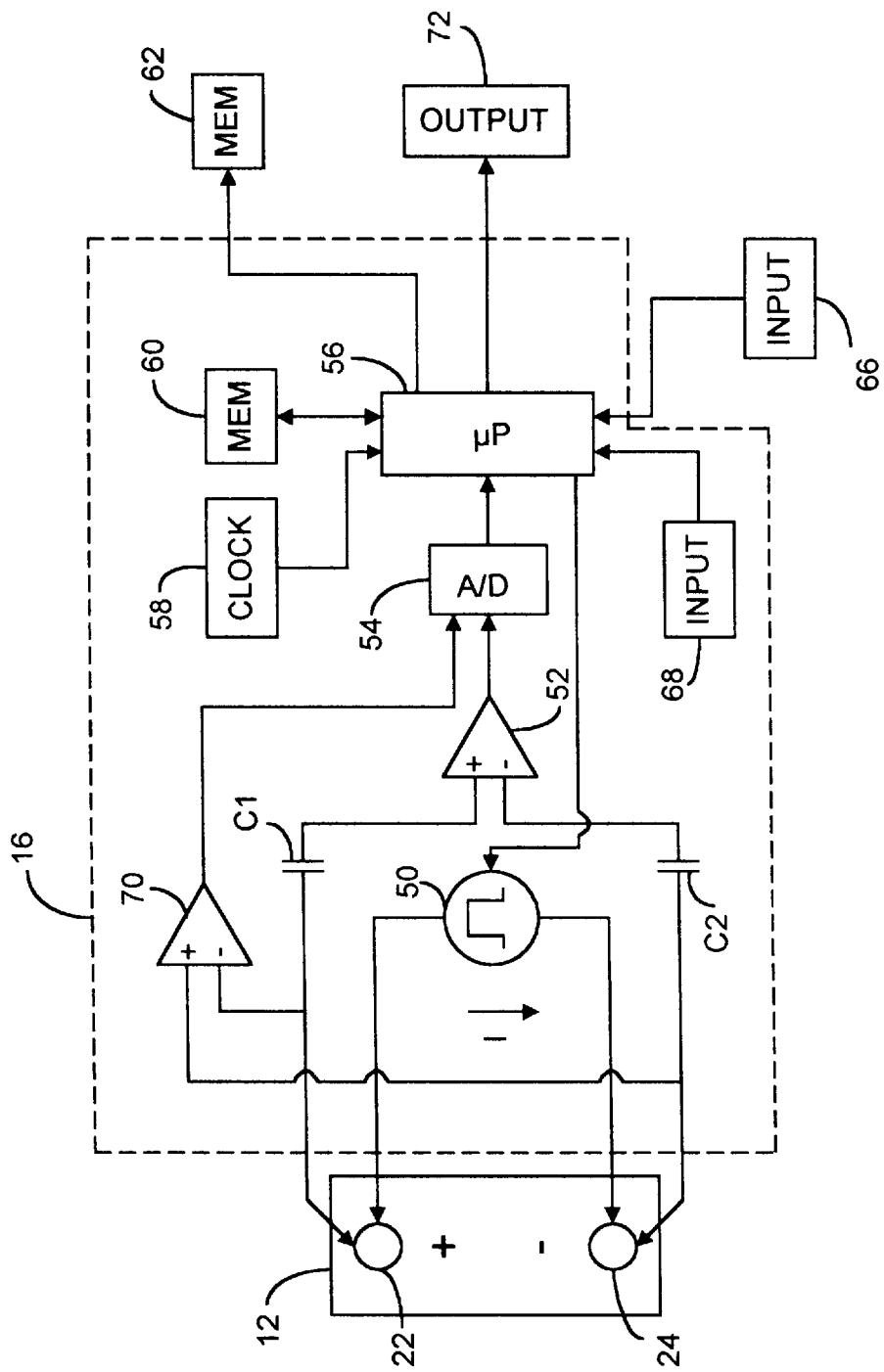
FIG. 1 is a simplified schematic diagram showing battery monitoring circuitry in accordance with the present invention.

FIG. 1 is a simplified block diagram of battery monitoring circuitry 16 in accordance with the present invention. Apparatus 16 is shown coupled to battery 12 which includes a positive battery terminal 22 and a negative battery terminal 24. Battery 12 is a battery rated using the JIS.

In preferred embodiments, circuitry 16 operates, with the exceptions and additions as discussed below, in accordance with battery testing methods described in one or more of the United States patents obtained by Dr. Champlin and listed above. Circuitry 16 operates in accordance with one embodiment of the present invention and determines the conductance ($G_{BAT}$) of battery 12 and the voltage potential ($V_{BAT}$) between terminals 22 and 24 of battery 12. Circuitry 16 includes current source 50, differential amplifier 52, analog-to-digital converter 54 and microprocessor 56. Amplifier 52 is capacitively coupled to battery 12 through capacitors $C_1$ and $C_2$. Amplifier 52 has an output connected to an input of analog-to-digital converter 54. Microprocessor 56 is connected to system clock 58, memory 60, memory 62 and analog-to-digital converter 54. Microprocessor 56 is also capable of receiving an input from input devices 66 and 68. Microprocessor 56 also connects to output device 72.

In operation, current source 50 is controlled by microprocessor 56 and provides a current I in the direction shown by the arrow in FIG. 1. In one embodiment, this is a square wave or a pulse. Differential amplifier 52 is connected to terminals 22 and 24 of battery 12 through capacitors $C_1$ and $C_2$, respectively, and provides an output related to the voltage potential difference between terminals 22 and 24. In a preferred embodiment, amplifier 52 has a high input impedance. Circuitry 16 includes differential amplifier 70 having inverting and noninverting inputs connected to terminals 22 and 24, respectively. Amplifier 70 is connected to measure the open circuit potential voltage ($V_{BAT}$) of battery 12 between terminals 22 and 24. The output of amplifier 70 is provided to analog-to-digital converter 54 such that the voltage across terminals 22 and 24 can be measured by microprocessor 56.

Circuitry 16 is connected to battery 12 through a four-point connection technique known as a Kelvin connection. This Kelvin connection allows current I to be injected into battery 12 through a first pair of terminals while the voltage V across the terminals 22 and 24 is measured by a second pair of connections. Because very little current flows through amplifier 52, the voltage drop across the inputs to amplifier 52 is substantially identical to the voltage drop across terminals 22 and 24 of battery 12. The output of differential amplifier 52 is converted to a digital format and is provided to microprocessor 56. Microprocessor 56 operates at a frequency determined by system clock 58 and in accordance with programming instructions stored in memory 60.

Microprocessor 56 determines the conductance of battery 12 by applying a current pulse I using current source 50. The microprocessor determines the change in battery voltage due to the current pulse I using amplifier 52 and analog-to-digital converter 54. The value of current I generated by current source 50 is known and is stored in memory 60. In one embodiment, current I is obtained by applying a load to battery 12. Microprocessor 56 calculates the conductance of battery 12 using the following equation:

$$\text{Conductance} = G_{BAT} = \frac{\Delta I}{\Delta V} \qquad \text{Equation 1}$$

where $\Delta I$ is the change in current flowing through battery 12 due to current source 50 and $\Delta V$ is the change in battery voltage due to applied current $\Delta I$.

Based upon the battery conductance $G_{BAT}$ and the battery voltage, the battery tester 16 determines the condition of battery 12. As discussed below in greater detail, battery tester 16 is programmed with information which can be used with the determined battery conductance arid voltage as taught in the above listed patents to Dr. Champlin. Using this method and battery testing apparatus, battery tests which are CA or CCA rating dependent can be applied to JIS rated batteries.

An SAE performance rating number (i.e., indicative of the CA and/or the CCA) is established for JIS rated batteries by performing the BCI test suite for determining performance ratings of SAE batteries. Once determined, these JIS-SAE reference numbers are provided through input 66 and programmed into microprocessor 56 and/or memory 60 of battery testing circuitry 16.

Conductance (impedance) and voltage discharge characteristics are established for each JIS rated battery. These unique discharge curves are also provided, through input 66, to microprocessor 56 and memory 60 for storage and/or preprogramming. These discharge curves provide the ability to make battery statement of health decisions on all JIS rated batteries.

Under the control of microprocessor 56, the automated battery tester presents a list, using output 72, of all JIS type designators to the user for selection. The JIS type designator is preferably the same number found on all JIS rated batteries. Therefore, the battery tester user does not need to know the CA or CCA performance rating of the JIS battery to be tested. The battery tester user simply selects the specific JIS battery number to be tested.

Using the JIS type designator, microprocessor 56 retrieves the correct CA or CCA performance number and specific conductance/voltage discharge curves from memory 60 for the specific JIS battery being tested.

The specific JIS-SAE reference cranking power along with the specific conductance/voltage discharge curve for a JIS battery allows the automated battery tester to make accurate battery state of health decisions. For example, if the battery conductance $G_{BAT}$ is lower than a predetermined threshold for a particular battery at a particular voltage, microprocessor 56 determines that battery 12 has failed the battery test. For example, as explained in the Champlin patents, the tester can compare the measured CCA (Cold Cranking Amp) with the rated CCA for that particular battery. Microprocessor 56 can also use information input from input device 66 provided by, for example, an operator. This information may consist of the particular type of battery, location, time, the name of the operator. Additional information relating to the conditions of the battery test can be received by microprocessor 56 from input device 68. Input device 68 may comprise one or more sensors, for example, or other elements which provide information such as ambient or battery temperature, time, date, humidity, barometric pressure, noise amplitude or characteristics of noise in the battery or in the test result, or any other information or data which may be sensed or otherwise recovered which relates to the conditions of the test how the battery test was performed, or intermediate results obtained in conducting the test. Additional Lest condition information is provided by microprocessor 56. Such additional test condition information may include the values of $G_{BAT}$ and battery voltage, the various inputs provided to battery tester 16 by the operator which may include, for example, type of battery, estimated ambient or battery temperature, type of vehicle (i.e., such as provided through the Vehicle Identification Number (VIN) code for the vehicle) or the particular sequence of steps taken by the operator in conducting the test.

Figure 2:
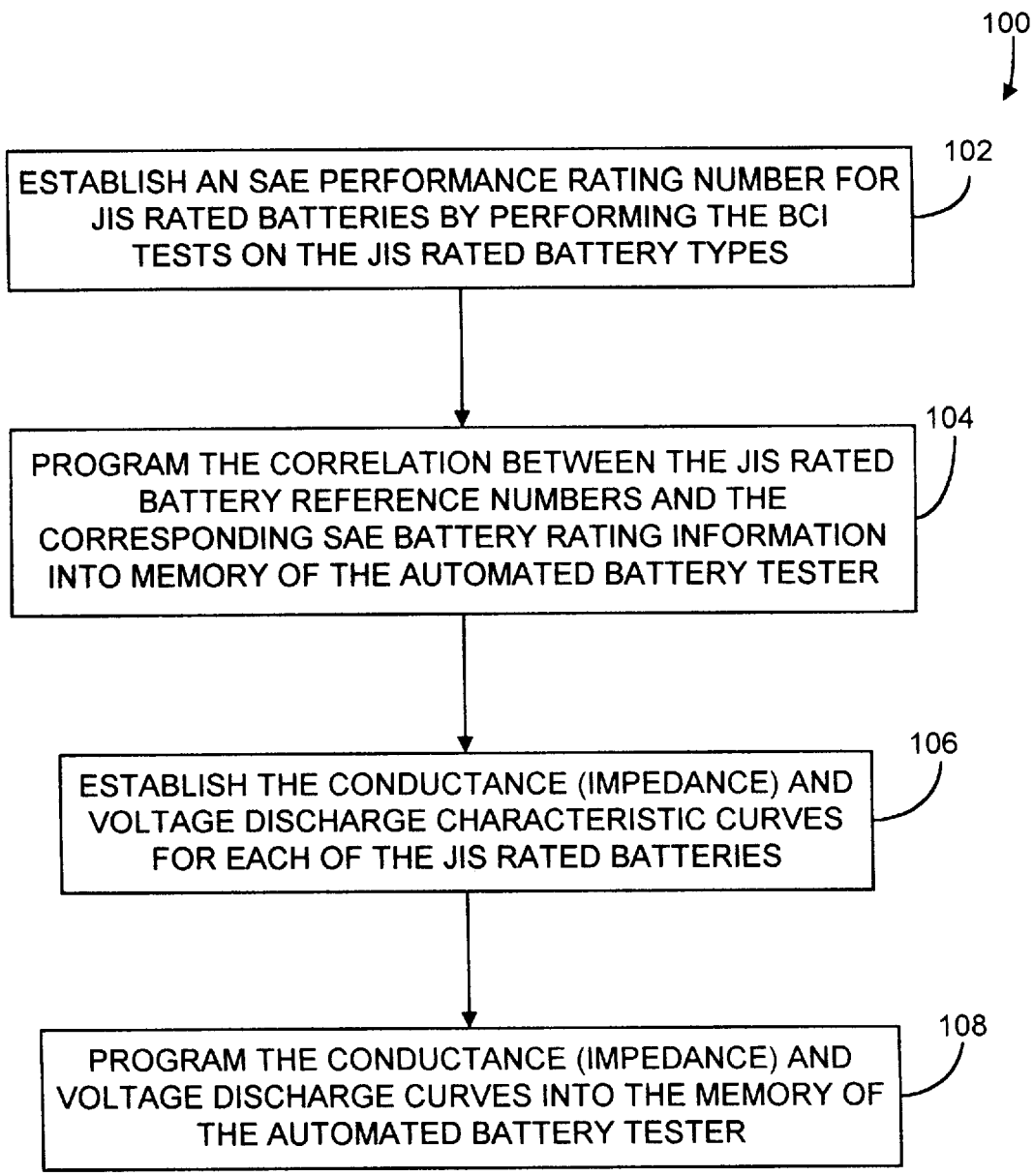
FIG. 2 is a simplified block diagram showing the steps of a method of programming a battery tester in accordance with the invention.

FIG. 2 is a simplified block diagram showing the manner in which battery tester circuitry 16 is adapted for use in testing JIS rated batteries. As shown in flow chart 100 at step 102, an SAE performance rating number is first established for a large number of JIS rated batteries by performing the BCI test on the JIS rated battery types. An alternative method of establishing SAE battery performance ratings for JIS batteries is to utilize the performance ranking number included in the JIS type designator. By using this performance ranking number and applying a variable coefficient factor, a formula can be established for deriving the corresponding CA or CCA performance rating. This calculated CA or CCA performance rating can then be used as a parameter in determining battery state of health.

As shown in step 104, the correlation between the JIS rated battery reference numbers and the corresponding SAE or other cranking amp based battery rating information is provided at input 66 for storage in memory 60. Next, as shown in step 106, the conductance (or impedance) and voltage discharge characteristic curves for each of the JIS rated batteries are determined. Determination of these discharge curves for the JIS rated batteries can be performed in the manner described in the previously discussed patents by Dr. Champlin. Next, as shown in step 108, the conductance and voltage discharge curves are provided to input 66 for programming microprocessor 56 and/or for storage in memory 60. At this point, battery testing circuitry 16 is ready to test JIS rated batteries.

Figure 3:
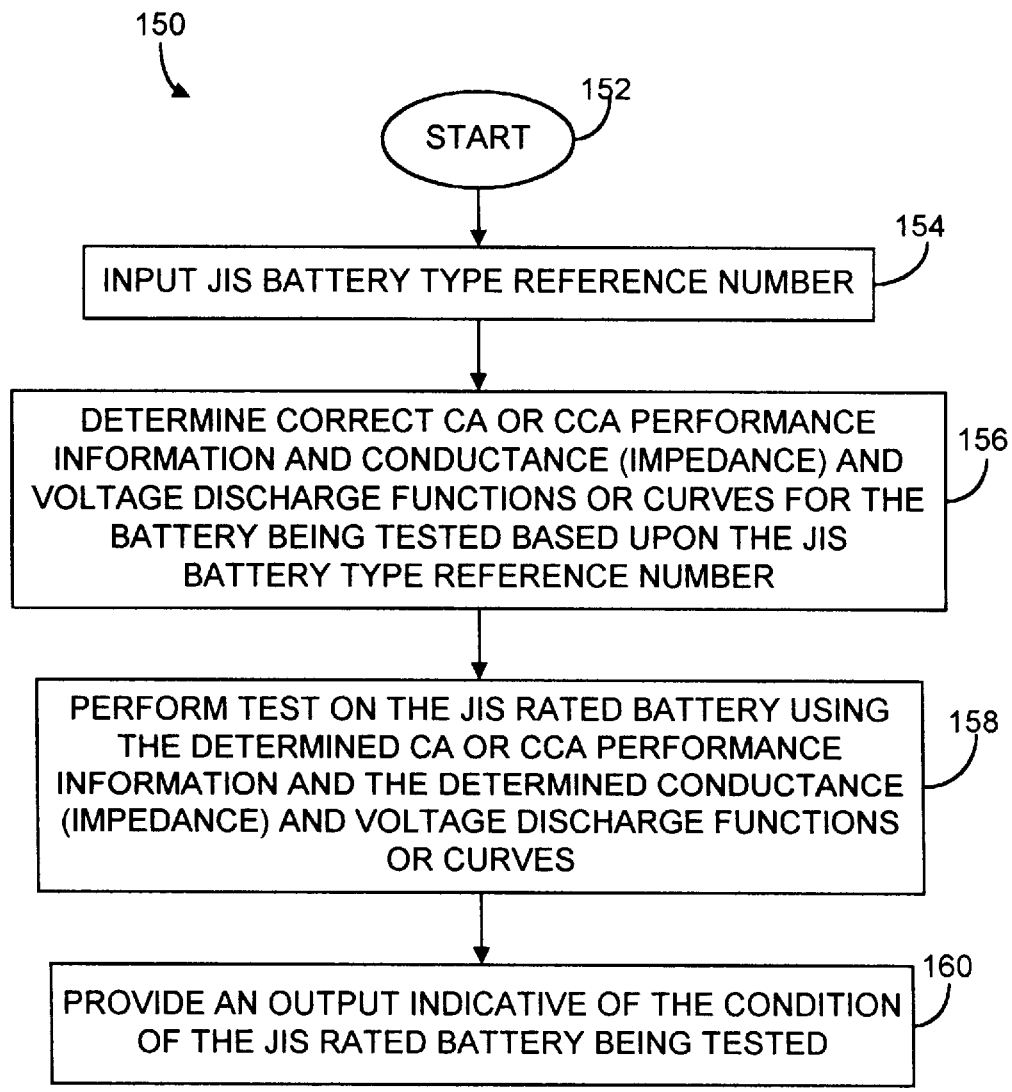
FIG. 3 is a simplified block diagram showing the steps of a method of testing a JIS rated battery in accordance with the present invention.

FIG. 3 is a simplified block diagram showing the manner in which battery testing circuitry 16 is used to test a JIS rated battery. FIG. 2 shows flow chart 150 which initiates operation at step 152. At step 154, user input is obtained. For example, user input is obtained through input device 66 and indicates an JIS battery type reference number. Preferably, microprocessor 56 controls output 72 such that a list of all JIS type designators is provided to the user for selection. This JIS type designator would preferably be the same number found on all JIS rated batteries of the particular battery type. Using input 66, the user selects the correct JIS designator for the particular battery being tested.

As shown in step 156, microprocessor 56 uses the selected JIS input designator to determine or access the correct CA or CCA performance information and conductance and voltage discharge functions or curves, from memory 60, for the battery being tested. Next, as shown at step 158, battery testing circuitry 16 performs the battery test on JIS rated battery 12 using the determined CA or CCA performance information and the determined conductance and voltage discharge functions or curves.

Finally, as shown at step 160, microprocessor 56 generates an output signal to output device 72 which causes an output indicative of the condition of JIS rated battery 12 to the user. The battery test results can be provided in a variety of different formats. Typically, in accordance with the JIS, a simple pass or fail indication will be provided. However, using cranking amps and discharge curve test methods disclosed in the patents to Dr. Champlin, a qualitative output can be provided to the user. In other words, the user of the battery tester can be informed of how close JIS rated battery 12 was to passing or failing the test.

Other user input information can be obtained through input device 66 and may constitute instructions for performing a battery test, the rated cold cranking amps (CCA) for the battery under test, estimated temperature during the test for temperature compensation during the test or any other user input related to the test or test environment. This information can be provided to microprocessor 56 and stored in memory 60 for use during the test. Additional information may relate to a particular vehicle in which the battery is installed which may be obtained, for example, using the VIN code for the vehicle. Further, the make, model and manufacturer of the battery 12 may be provided. Other such information can include battery specific information, such as a serial number, digital signature for tracking and identifying the battery, make, model, and date of manufacture of the battery, etc. Such information may be manually input or, for example, read from a bar code carried on the battery.

Although the present invention has been described with reference to preferred embodiments, workers skilled in the art will recognize that changes may be made in form and detail without departing from the spirit and scope of the invention. For example, one may use other input mechanisms to obtain test condition information or employ other battery tests than those explicitly described Further, while the present invention has been described with reference to the JIS battery testing code, the present invention can be used to test batteries rated using any battery type specific standard or code. The present invention is particularly adapted for testing batteries which have been rated using a standard or code which is not indicative of the battery's CA or CCA. In preferred embodiments, the method and battery tester of the present invention applies a CA or CCA type battery test to batteries which have been rated using a non CA or CCA indicative code or standard. Usually, the particular code or standard classification or rating is printed on an outer surface of the battery by the battery manufacturer.

Another change that is considered within the spirit and scope of the invention relates to updating the battery tester with information on new or additional batteries. Either through one of the input devices, or through replacement of a memory module, the battery tester of the present invention can be updated to include information on additional batteries. Thus, battery specific testing of batteries rated under a non CA or CCA indicative code can be accomplished for virtually all batteries on the market.

What is claimed is:

1. A method of testing a battery rated using the Japanese Industrial Standard (JIS), the method comprising:

inputting a JIS battery type reference number into a battery tester;

determining battery test information for the battery as a function of the JIS battery type reference number, wherein the battery test information is representative of a rating of the battery using a second standard;

performing a battery test on the battery using the battery tester and the determined battery test information representative of the rating of the battery using the second standard, and responsively obtaining a test result; and providing a battery tester output indicative of a condition of the battery based upon the test result.

2. The method of claim 1, wherein determining battery test information for the battery as a function of the JIS battery type reference number further includes determining a Battery Council International (BCI) cranking amps rating established for the JIS battery type.

3. The method of claim 2, wherein determining battery test information for the battery as a function of the JIS battery type reference number further includes determining conductance characteristics established for the JIS battery type.

4. The method of claim 3, wherein determining battery test information for the battery as a function of the JIS battery type reference number further includes determining voltage discharge characteristics established for the JIS battery type.

5. An apparatus for testing the condition of a battery rated using the Japanese Industrial Standard (JIS), the apparatus comprising:

an output device controlled to present to a user of the apparatus a list containing a plurality of JIS battery type designators found on a plurality of different JIS rated batteries;

input circuitry receiving from the user a JIS battery type designator associated with the battery and chosen from the list;

battery test circuitry coupled to the input circuitry and coupleable to the battery for performing a battery test on the battery and providing a battery test result, wherein the battery test circuitry is coupled to the battery during testing of the battery, wherein the battery test circuitry receives the JIS battery type designator from the input circuitry and responsively determines battery test information for the battery as a function of the received JIS battery type designator, wherein the determined battery test information includes a Battery Council International (BCI) cranking amps rating established for the JIS battery type, wherein the determined battery test information further includes conductance and voltage discharge characteristics established for the JIS battery type, and wherein the battery test circuitry performs the battery test using the determined battery test information; and output circuitry providing an output indicative of a condition of the battery based upon the battery test result.

6. A method of manufacturing a battery tester, the method comprising:

providing a battery tester;

testing a plurality of Japanese Industrial Standard (JIS) rated batteries using Battery Council International (BCI) tests to establish test results representative of a BCI cranking amps rating for each of the plurality of JIS rated battery types;

correlating JIS type designators associated with each of the plurality of JIS rated battery types to established BCI cranking amps ratings; and programming a microprocessor in the battery tester with the JIS type designators associated with each of the plurality of JIS rated battery types and the correlated BCI cranking amps ratings such that an input from a user of the battery tester which is representative of a particular JIS type designator of a battery connected to the battery tester will cause the battery tester to test the battery using the correlated BCI cranking amps rating.

* * * * *